(12) United States Patent
Wong

(10) Patent No.: US 12,360,141 B2
(45) Date of Patent: Jul. 15, 2025

(54) DRONE SYSTEM FOR POWERLINE INSPECTION USING RADIO FREQUENCY SCANNING TECHNIQUES

(71) Applicant: DX Tech Pty Ltd, Prahran (AU)

(72) Inventor: Khoi Loon Wong, Melbourne (AU)

(73) Assignee: DX Tech Pty Ltd, Prahran (AU)

( * ) Notice: Subject to any disclaimer, the term of this patent is extended or adjusted under 35 U.S.C. 154(b) by 123 days.

(21) Appl. No.: 18/448,717

(22) Filed: Aug. 11, 2023

(65) Prior Publication Data

US 2024/0003945 A1 Jan. 4, 2024

Related U.S. Application Data

(63) Continuation of application No. 18/252,584, filed as application No. PCT/IB2021/060574 on Nov. 15, 2021.

(Continued)

(51) Int. Cl.
*G01R 31/00* (2006.01)
*G01R 19/25* (2006.01)
(Continued)

(52) U.S. Cl.
CPC ....... *G01R 19/2513* (2013.01); *G01R 31/085* (2013.01); *G01S 5/0249* (2020.05);
(Continued)

(58) Field of Classification Search
CPC .. G01R 31/085; G01R 31/12; G01R 31/1272; G01R 19/21; G01R 19/513;
(Continued)

(56) References Cited

U.S. PATENT DOCUMENTS 7,987,071 B1 7/2011 Dorfman et al.
10,137,984 B1 11/2018 Flick
(Continued)

FOREIGN PATENT DOCUMENTS

WO 2017176324 A1 10/2017
WO 2020144391 A1 7/2020

OTHER PUBLICATIONS

Office Action for Canadian Patent Application No. 3199041, mailed Nov. 15, 2024, 7 pages.
(Continued)

*Primary Examiner* — Thang X Le
(74) *Attorney, Agent, or Firm* — DLA PIPER LLP (US)

(57) ABSTRACT

A system for housing a drone for locating a source in an electrical structure includes a plurality of drones capable of hovering in positions to form a virtual enclosure around an electrical structure and a server communicably coupled to the drones. The virtual enclosure is divided into a plurality of cells. The drone is configured to measure a plurality of time difference of arrival (TDOA) values from signals originating from the source; calculate a plurality of propagation times comprising a propagation time for a calibration signal that travels from a drone to each of the plurality of cells; and send the TDOA values and the propagation times to a server. The server is configured to receive the TDOA values and the propagation times from the plurality of drones; and determine a location of the source based on the plurality of TDOA values and the plurality of propagation times.

20 Claims, 15 Drawing Sheets

Related U.S. Application Data

(60) Provisional application No. 63/114,028, filed on Nov. 16, 2020.

(51) Int. Cl.
    *G01R 31/08*     (2020.01)
    *G01S 5/02*      (2010.01)
    *G05D 1/00*      (2006.01)
    *H02G 1/02*      (2006.01)
    *B64U 80/25*     (2023.01)
    *B64U 101/26*    (2023.01)
    *B64U 101/30*    (2023.01)

(52) U.S. Cl.
    CPC .............. *G05D 1/104* (2013.01); *H02G 1/02* (2013.01); *B64U 80/25* (2023.01); *B64U 2101/26* (2023.01); *B64U 2101/30* (2023.01); *B64U 2201/104* (2023.01); *G01S 2205/03* (2020.05)

(58) Field of Classification Search
    CPC ... G01S 5/0249; G01S 5/02213; G05D 1/104; G05D 1/225; G05D 1/2465; G05D 1/6987; G05D 1/689; G05D 1/695; G05D 1/646
    See application file for complete search history.

(56) References Cited

U.S. PATENT DOCUMENTS

| | | | |
|---|---|---|---|
| 10,173,773 B1 | 1/2019 | Flick | |
| 10,669,025 B1 | 6/2020 | Flick | |
| 10,752,355 B1 | 8/2020 | Flick | |
| 10,956,980 B1 | 3/2021 | Flick | |
| 10,983,223 B2* | 4/2021 | Moore | G01S 19/51 |
| 11,027,841 B1 | 6/2021 | Flick | |
| 11,117,665 B1 | 9/2021 | Flick | |
| 12,045,068 B2 | 7/2024 | Jones | |
| 2020/0225274 A1 | 7/2020 | Manson et al. | |
| 2020/0354056 A1 | 11/2020 | Borras | |
| 2020/0389059 A1* | 12/2020 | Sim | G05D 1/101 |
| 2021/0034027 A1* | 2/2021 | Datta | G06N 20/00 |
| 2021/0173414 A1* | 6/2021 | Starr | G08G 5/21 |
| 2021/0190847 A1* | 6/2021 | McSchooler | B64D 1/02 |
| 2021/0237866 A1* | 8/2021 | Groninga | B60L 50/53 |
| 2023/0061934 A1* | 3/2023 | Stein | G05D 1/622 |

OTHER PUBLICATIONS

PCT International Application No. PCT/IB21/60574, International Search Report and Written Opinion of the International Searching Authority, dated Jan. 31, 2022, 5 pages.

Moore, et al., "UAV Inspection of Electrical Transmission Infrastructure with Path Conformance Autonomy and Lidar-based Geofences NASA Report on UTM Reference Mission Flights at Southern Company Flights Nov. 2016," No. L-20871, Oct. 2017, 27 pages.

Digulescu, et al., "Electrical arc surveillance and localization system based on advanced signal processing techniques," 2014 IEEE International Energy Conference (Energycon), IEEE, May 2014, 5 pages.

Robles, et al., "Antenna deployment for the localization of partial discharges in open-air substations," 2nd International Conference on Sensors and Applications, Apr. 2016, 11 pages.

Office Action for Australian Patent Application 2021380126 dated Feb. 14, 2024, 3 pages.

* cited by examiner

DRONE SYSTEM FOR POWERLINE INSPECTION USING RADIO FREQUENCY SCANNING TECHNIQUES

CROSS-REFERENCE TO RELATED APPLICATIONS

This application is a continuation of U.S. application Ser. No. 18/252,584, filed May 11, 2023, which is the National Stage filing under 35 U.S.C. 371 of International Application No. PCT/IB2021/060574, filed Nov. 15, 2021, which claims priority to U.S. Provisional Patent Application No. 63/114,028 filed on Nov. 16, 2020, which are hereby incorporated by reference in their entireties.

BACKGROUND OF THE DISCLOSURE

Powerline inspection can be a very effective method for finding defects on powerline assets such as transmission and distribution lines and towers. Defects can include leakage from components such as insulators, conductor clamps, etc. Prompt detection of such defects has become increasingly important as powerline-caused fires increase in frequency and severity. It is common for line inspections to be routinely carried out by line inspectors either on foot or in a vehicle equipped with a camera and thermal imaging equipment. Aerial inspection of powerlines using fixed-wing aircraft or helicopters has also been in use for the past few decades. However, recent increases in availability, popularity, and complexity have allowed drones to be considered as potential alternatives for powerline inspections.

SUMMARY

Embodiments of the present disclosure include a system for powerline inspection. The system can include a plurality of data collection units positioned on a plurality of powerline structures, wherein each data collection unit is associated with a sensor group positioned on a respective powerline structure. Each data collection unit can be configured to receive measured radio frequency (RF) data from the sensor group; and transmit the measured RF data. The system can also include a server that can be configured to receive the measured RF data from the data collection unit; analyze the measured RF data to detect an RF event; calculate a geolocation of the RF event; and in response to detecting the RF event, send an alert and the geolocation of the RF event to a closest nest. The system can also include a plurality of nests positioned on the plurality of powerline structures. Each nest can be configured to house a drone; and receive the alert from the server. The drone can include at least one RF sensor and can be configured to, in response to the alert being received by an associated nest, autonomously travel to the geolocation; perform RF measurements via the at least one RF sensor at the geolocation; upload the RF measurements to the server; and return to the associated nest.

In some embodiments, the drone can be configured to capture at least one of images or videos at the geolocation; and send the at least one of captured images or videos to the server. In some embodiments, the associated nest can be connected to a power source and is configured to charge the drone while housing the drone. In some embodiments, autonomously traveling to the geolocation can include traveling via one of a plurality of flight paths pre-programmed into a memory of the drone; or traveling via a combination of two or more of the plurality of flight paths pre-programmed into the memory of the drone.

In some embodiments, the sensor group and the at least one RF sensor can be configured to measure signals from power frequencies between about 50 Hz and 3 GHz. In some embodiments, a distance between powerline structures where data collection units are positioned can be up to twenty miles. In some embodiments, the alert can include an energy level of the detected RF event. In some embodiments, the drone can be configured to perform RF measurements at a safe approach distance. In some embodiments, the drone can include GPS functionality and can be configured to perform time-synchronized RF measurements via the at least one RF sensor in coordination with location information from the GPS functionality.

According to another aspect of the present disclosure, a system for housing a drone for inspecting a section of electrical grid can include a nest connected to a power supply and positioned on a powerline structure configured to house a drone; charge the drone while the drone is housed; and receive an alert from a server, the alert indicating a geolocation of a detected radio frequency (RF) event. The system can also include a drone comprising at least one RF sensor. The drone can be configured to in response to the alert being received by the nest, autonomously travel to the geolocation; perform RF measurements via the at least one RF sensor at the geolocation; upload the RF measurements to the server; and return to the nest.

In some embodiments, the drone can be configured to capture at least one of images or videos at the geolocation; and send the at least one of captured images or videos to the server. In some embodiments, autonomously traveling to the geolocation can include traveling via one of a plurality of flight paths pre-programmed into a memory of the drone; or traveling via a combination of two or more of the plurality of flight paths pre-programmed into the memory of the drone. In some embodiments, the alert can include an energy level of the detected RF event. In some embodiments, the sensor group and the at least one RF sensor can be configured to measure signals from power frequencies between about 50 Hz and 3 GHz. In some embodiments, the drone can be configured to perform RF measurements at a safe approach distance. In some embodiments, the drone can include GPS functionality and can be configured to perform time-synchronized RF measurements via the at least one RF sensor in coordination with location information from the GPS functionality.

According to another aspect of the present disclosure, a method performed by a server for inspecting a section of electrical grid via drone can include receiving measured radio frequency (RF) data from a data collection unit positioned on a powerline structure; analyzing the measured RF data to detect an RF event; calculate a geolocation of the RF event; and in response to detecting the RF event, sending an alert and the geolocation of the RF event to a nest positioned on the powerline structure, wherein the alert triggers an autonomous launch of a drone housed in the nest to travel to the geolocation.

In some embodiments, the method can include, after the drone has autonomously launched, receiving at least one of RF measurements, images, or video data from the drone. In some embodiments, the measured RF data and the RF measurements can include measurements of signals from power frequencies between about 50 Hz and 3 GHz. In some embodiments, the drone can be configured to travel to the geolocation via one of a plurality of flight paths pre-programmed into a memory of the drone; or travel to the geolocation via a combination of two or more of the plurality of flight paths pre-programmed into the memory of the drone.

According to another aspect of the present disclosure, a system for locating a source in an electrical structure can include a plurality of drones capable of hovering in positions to form a virtual enclosure around an electrical structure, wherein the virtual enclosure is divided into a plurality of cells. Each drone can be configured to measure a plurality of time difference of arrival (TDOA) values from signals originating from the source; calculate a plurality of propagation times comprising a propagation time for a calibration signal that travels from a respective drone to each of the plurality of cells; and send the plurality of TDOA values and the plurality of propagation times to a server. The system can also include a server communicably coupled to the plurality of drones configured to receive the plurality of TDOA values and the plurality of propagation times from the plurality of drones; and determine a location of the source based on the plurality of TDOA values and the plurality of propagation times.

In some embodiments, the plurality of drones can include at least four drones. In some embodiments, each of the plurality of drones can include at least one radio frequency (RF) sensor configured to measure signals from power frequencies between about 50 Hz and 3 GHz. In some embodiments, the plurality of drones can be configured to perform measurements at a safe approach distance from the electrical structure. In some embodiments, each of the plurality of drones can include GPS functionality and the plurality of drones is configured to perform time-synchronized RF measurements using the GPS functionality.

In some embodiments, each of the plurality of cell can be between about 1 m×1 m×1 m and 10 m×10 m×10 m. In some embodiments, determining a location of the source based on the plurality of TDOA values and the plurality of propagation times can include identifying a cell of the plurality of cells with a highest likelihood of being the source. In some embodiments, identifying a cell of the plurality of cells with a highest likelihood of being the source can include applying a binary particle swamp optimization method.

According to another aspect of the present disclosure, a method performed by a server for locating a source in an electrical structure can include receiving, from a plurality of drones, a plurality of time difference of arrival (TDOA) values from signals originating from a source on an electrical structure, wherein the plurality of drones are hovering in positions to form a virtual enclosure around the electrical structure, the virtual enclosure being divided into a plurality of cells; receiving, from the plurality of drones, a plurality of propagation times comprising a propagation time for a calibration signal that travels from a respective drone to each of the plurality of cells; and analyzing the plurality of TDOA values and the plurality of propagation times to determine a location of the source.

In some embodiments, determining a location of the source based on the plurality of TDOA values and the plurality of propagation times can include identifying a cell of the plurality of cells with a highest likelihood of being the source. In some embodiments, identifying a cell of the plurality of cells with a highest likelihood of being the source can include applying a binary particle swamp optimization method. In some embodiments, each of the plurality of cell can be between about 1 m×1 m×1 m and 10 m×10 m×10 m.

In some embodiments, the plurality of drones can include at least four drones. In some embodiments, each of the plurality of drones can include at least one radio frequency (RF) sensor configured to measure signals from power frequencies between about 50 Hz and 3 GHz. In some embodiments, each of the plurality of drones can include GPS functionality and the plurality of drones can be configured to perform time-synchronized RF measurements using the GPS functionality.

According to another aspect of the present disclosure, a method for locating a source in an electrical structure can include positioning a plurality of drones in positions to form a virtual enclosure around an electrical structure comprising a source emitting signals; dividing the virtual enclosure into a plurality of cells; measuring a plurality of time difference of arrival (TDOA) values from the signals originating from the source; calculating a plurality of propagation times comprising a propagation time for a calibration signal that travels from a respective drone to each of the plurality of cells; and sending the plurality of TDOA values and the plurality of propagation times to a server, wherein the server determines a location of the source based on the plurality of TDOA values and the plurality of propagation times.

In some embodiments, each of the plurality of drones can include at least one radio frequency (RF) sensor configured to measure signals from power frequencies between about 50 Hz and 3 GHz. In some embodiments, each of the plurality of cell can be between about 1 m×1 m×1 m and 10 m×10 m×10 m. In some embodiments, each of the plurality of drones can include GPS functionality and the plurality of drones can be configured to perform time-synchronized RF measurements using the GPS functionality. In some embodiments, the plurality of drones can be configured to perform measurements at a safe approach distance from the electrical structure.

BRIEF DESCRIPTION OF THE DRAWINGS

Various objectives, features, and advantages of the disclosed subject matter can be more fully appreciated with reference to the following detailed description of the disclosed subject matter when considered in connection with the following drawings, in which like reference numerals identify like elements.

Figure 1:
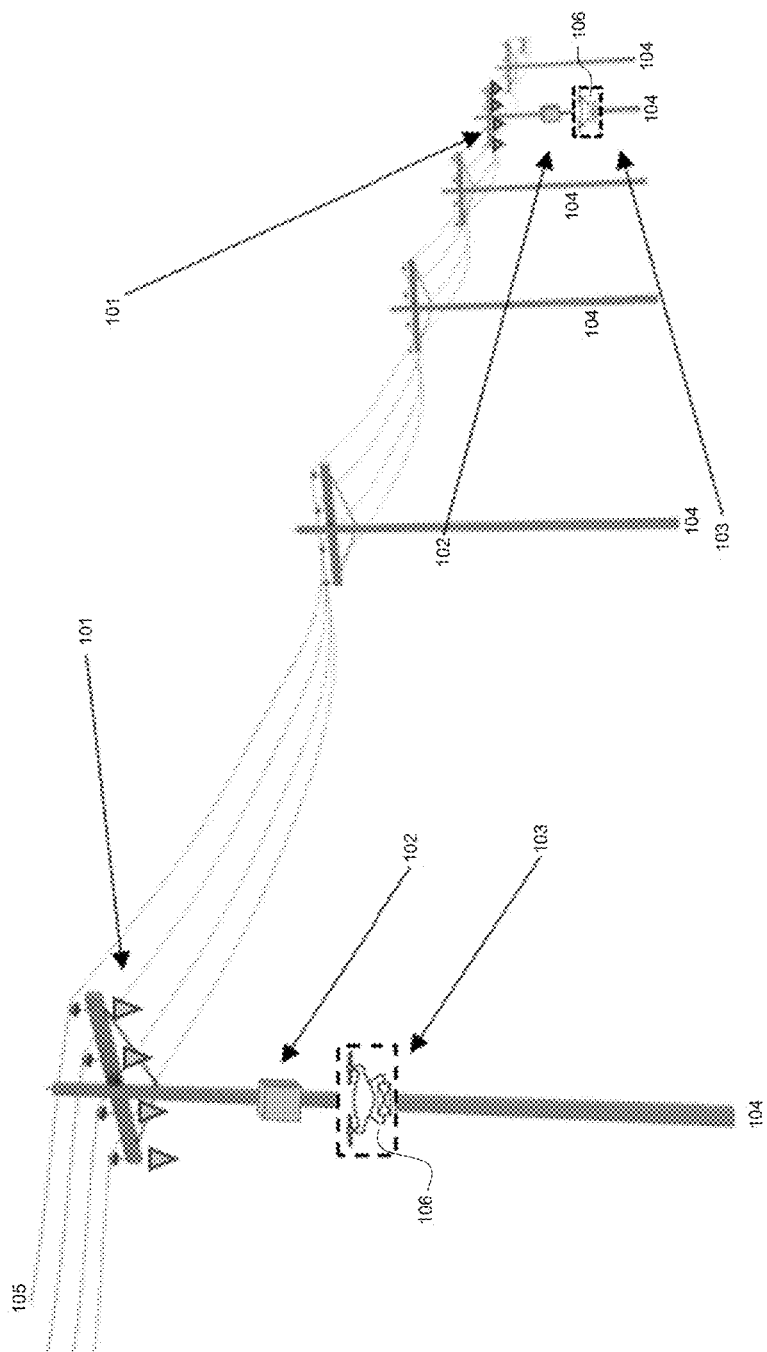
FIG. 1 shows a drone system for powerline inspection, according to some embodiments of the present disclosure.

The drawings are not necessarily to scale, or inclusive of all elements of a system, emphasis instead generally being placed upon illustrating the concepts, structures, and techniques sought to be protected herein.

DETAILED DESCRIPTION

The following detailed description is merely exemplary in nature and is not intended to limit the invention or the applications of its use.

Drones can be equipped with various gadgetry, sensor systems, and payloads such as cameras, LiDAR scanners, IR thermal imaging equipment, ultra-violet corona cameras, etc. However, drones with such extensive payloads can have limited use due to cost, both monetary and processing capability-wise. 3D LiDAR scanners and corona imaging equipment is very expensive and can have length processing times of the associated images, video, and LiDAR data. When employed for coverage of extensive ranges of powerlines, the data loads and processing requirements can hinder quick detection and increase the risk of unidentified powerline defects and thus fires caused by such defects. Additionally, the intermittent nature of discharges from failing equipment can be difficult to detect with standard and regular inspections. In addition, drone-based inspection is typically carried out on a regular and cyclic basis (e.g., monthly or yearly) and typically involves a single drone, which must inspect an entire feeder or section of a feeder or powerline by itself. In many cases, because of the cyclic nature of inspection, there are large gaps in time between subsequent inspections of a specific components or sector of a feeder or powerline and, if there is some sort of defect, it may not be detected until the next inspection in the cycle.

Embodiments of the present disclosure relate to various systems and methods for powerline inspection using a system of drones. The inspection system can be used for various portions of the electrical grid, which can include powerlines, transformers, powerline structures (e.g., poles, H-structures, and the like), transmission towers, and the like. The system can employ one or more drones that conduct aerial inspections to detect emerging faults on transmission and distribution lines using radio frequency (RF) data collection devices, global positioning system (GPS) antennas, wireless and cellular communication systems, and high definition cameras with monocular or stereo vision. The one or more drones can each be housed on a powerline structure or transmission tower in a drone "nest." The nest can be a weather-proof pod with self-charging and wireless charging. Inspection processes can be triggered via an early fault detection alert, such as the one described in U.S. Provisional Patent No. 62/971,296 ("Methods and systems for detection, location, and characterization of signal sources in electrical infrastructure using distributed sensors") or U.S. Pat. No. 9,606,164 ("Fault detection system"), both of which are herein incorporated by reference in their entirety. Drone inspections can be initiated based on locations identified as high-risk or as high-energy spots by various data collection units that are situated along electrical infrastructure, such as on powerline structures. The data collection units can include cellular communications, RF data controllers to receive data from permanently installed RF sensors along the powerline, and other features designed for consistent availability and aiding in fully automated inspection operations. A cloud server can receive and analyze the RF data from the data collection devices and detect an RF event or irregularity; once an event is detected, an alert can be generated and sent to the nearest nest housing a drone, which can then self-launch and autonomously travel to the identified location (e.g., a specific tower, structure, or segment of powerline) and perform an inspection procedure on the identified location. The drone can conduct various types of data analysis (e.g., RF analysis, image and video capture, etc.), upload the data to a cloud server, and return to its associated nest. Meanwhile, the server can analyze the received data to determine a more precise location of the defect, thus allowing for repairs and maintenance to quickly be dispersed.

Examples of RF events can include punctures in the insulation of wires, conductors with broken strands, vegetation touching the powerline, a conductor clash or slap, animal-related faults, and/or tree or other vegetation related faults. As described above, the geolocation of a detected RF event can be determined via the techniques described in U.S. Provisional Patent No. 62/971,296. Many times, defects can also be intermittent and can appear and then disappear for a few hours. This can pose challenges to accurately determining the location of and performing a closer inspection. By the time an inspector or previous drone inspectors get to the approximate location of the site, they are unable to locate the defect. However, embodiments of the present disclosure allow for the real-time deployment of inspection drones that utilize pre-programmed flight paths to obtain closer and more accurate location information for a potential defect.

FIG. 1 shows a drone system for powerline inspection, according to some embodiments of the present disclosure. The illustration of FIG. 1 shows an example segment of powerline that can be subject to inspection using the descriptions herein. For example, the inspected portion can include a plurality of powerline poles 104, each connected by a powerline 105. Note, FIG. 1 is not intended to be limiting and an inspected portion can include any number of powerline poles and any reasonable length of powerline, and can also include powerline transmission towers, as described later, such as in FIGS. 6A-6B. The drone inspection system used to protect the various powerline components can include a plurality of RF sensors 101, a plurality of data collection units 102, a plurality of nests 103, and a plurality of drones 106, each drone 106 being assigned to or associated with a nest 103. Each data collection unit 102 can include two or more RF controllers and can be configured to detect RF waves and pulses travelling along the powerlines 105 via the sensors 101; in many cases, the sensors 101 may be permanently installed. A possible distance between sets of installed sensors 101 can be up to twenty miles. The RF sensors 101 can be sensors as described in U.S. Provisional Patent 62/971,296 and can be used to detect deterioration, compromise, and defects in electrical infrastructure. In some embodiments, the data collected can be used by the data collection units 102 to develop a risk score heat map for various sections of monitored infrastructure. The sensors 101 can pick up RF traveling along the powerline 105 which can be used to triangulate where the source is located. In some embodiments, a "sensor set" can refer to a group of sensors on a particular powerline structure.

The detected data from data collection units 102 can be sent to a cloud server (not shown) for post-processing. The location and energy level of an RF event can then be calculated in the cloud server. Once an RF event or spike that suggests a high likelihood of a defect is detected, an alert can be sent from the cloud server to the nest 103. The alert can include a location, and the drone 106 can then, via internal pre-programmed flight paths, autonomously travel to the identified location to perform other types of data collection as described herein. Once the data collection has been completed and sent to a cloud server (not shown in FIG. 1), the drone 106 can return to its respective nest 103 for charging, storage, and protection. Additional details related to the functionality of the data collection units 102 and drones 106 are described in FIGS. 2A-2D.

Figure 2A:
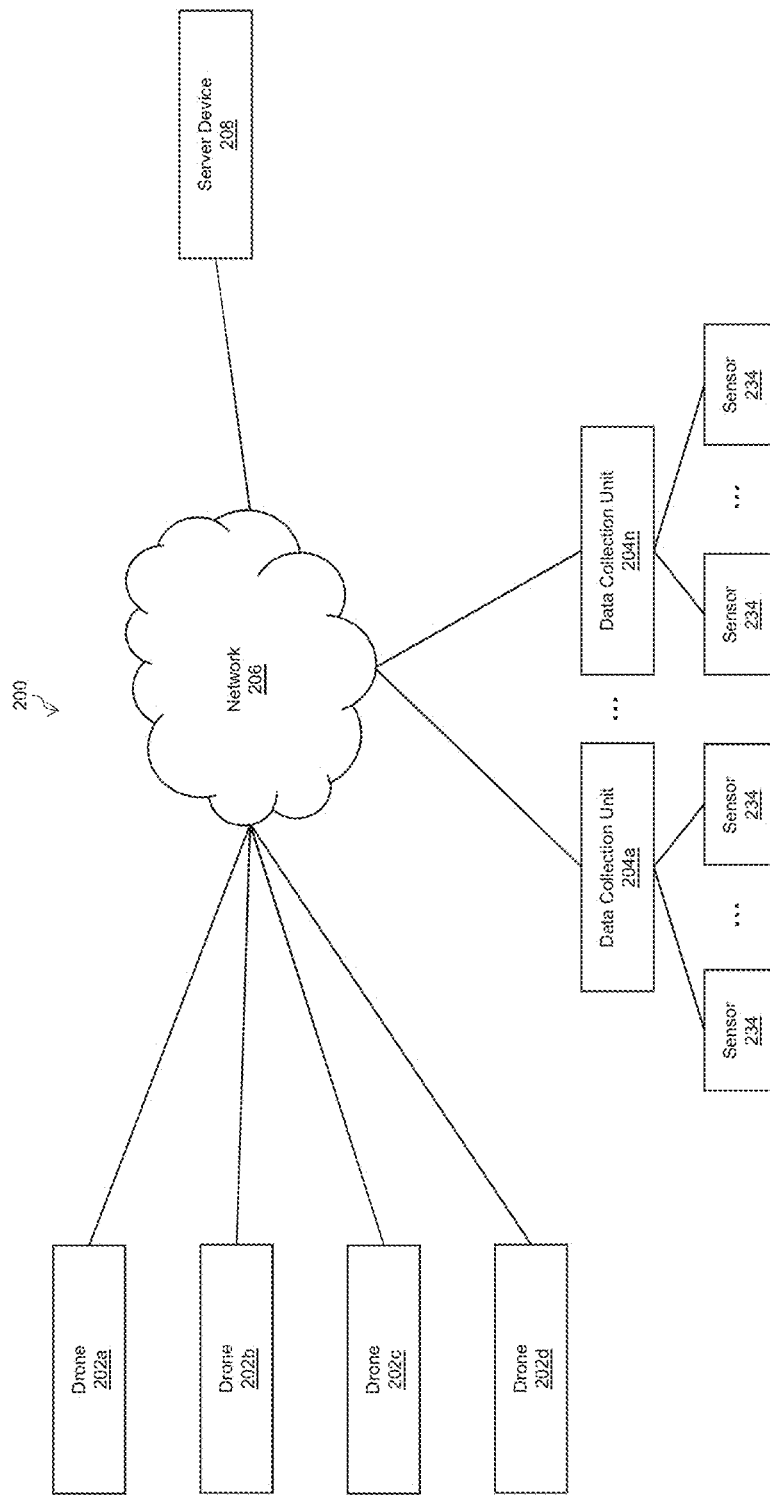
FIGS. 2A-2D show various block diagrams of a drone system for powerline inspection, according to some embodiments of the present disclosure.

FIGS. 2A-2D show various block diagrams of a drone system 200 for powerline inspection, according to some embodiments of the present disclosure. In particular, FIG. 2A shows a block diagram of the drone system 200 for powerline inspection. System 200 can include a plurality of drones 202a-d (generally referred to herein as "drone 202" or collectively referred to herein as "drones 202"), a plurality of data collection units 204a-n (generally referred to herein as "data collection unit 204" or collectively referred to herein as "data collection units 204"), and a server 208, which can be all be communicably coupled via network 206. Additionally, the system 200 can include a plurality of sensors 234 (e.g., RF sensors), with various subsets of sensors 234 associated with and configured to send RF measurements and collected RF data to a specific data collection unit 204. In some embodiments, the number of data collection units 204 can be the same as the number of drones 202, as each data collection unit 204 can be configured to function as a nest for a drone 202. The plurality of drones 202 can be configured to travel in synchronization and work together to gather RF and other data and determine locations. In addition, similar to as described in FIG. 1, each data collection unit 204 can be mounted or positioned on a powerline structure in a powerline network. Each data collection unit 204 can also have a number of sensors 234 positioned nearby in order to facilitate the providing of RF measurements.

Network 206 may include one or more wide areas networks (WANs), metropolitan area networks (MANs), local area networks (LANs), personal area networks (PANs), or any combination of these networks. Network 206 may include a combination of one or more types of networks, such as Internet, intranet, Ethernet, twisted-pair, coaxial cable, fiber optic, cellular, satellite, IEEE 801.11, terrestrial, and/or other types of wired or wireless networks. Network 206 can also use standard communication technologies and/or protocols. Network 206 can include wireless internet functionality, wireless connectivity, and/or cellular functionality to facilitate wireless interconnectedness between the drones 202, data collection units 204, and the server device 208.

Server device 208 may include any combination of one or more of web servers, mainframe computers, cloud-based servers, general-purpose computers, personal computers, or other types of computing devices. Server device 208 may represent distributed servers that are remotely located and communicate over a communications network, or over a dedicated network such as a local area network (LAN). Server device 208 may also include one or more back-end servers for carrying out one or more aspects of the present disclosure. In some embodiments, server device 208 may be the same as or similar to server device 1100 described below in the context of FIG. 11.

Figure 2B:
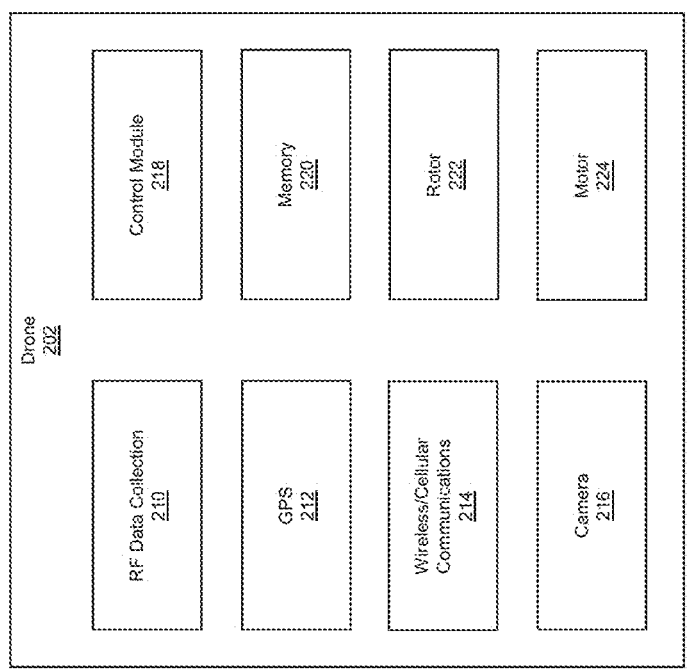

FIG. 2B is a block diagram of an example drone 202, as used in system 200. Drone 202 be any type of drone known in the art that can be commonly referred to as an unmanned aerial vehicle (UAV). In some embodiments, a drone 202 of the present disclosure can be controlled by a human operator, piloted by an autonomous robot, or can move autonomously via onboard instructions and controllers. In some embodiments, a drone 202 can include RF data collection componentry 210, GPS 212, wireless/cellular communications functionality 214, a camera 216, a control module 218, a memory 220, a rotor 222, and a motor 224. The RF data collection componentry 210 can include various types of RF sensors and can be configured to measure signals from power frequencies between 50 to 60 Hz and up to 3 GHz. The RF sensors within the RF data collection componentry 210 can be sensors as described in U.S. Provisional Patent 62/971,296 and can be used to detect deterioration, compromise, and defects in electrical infrastructure. The control module 218 can include a processor that is coupled in communication with the RF data collection componentry 210, the wireless/cellular communications functionality 214, the memory 220, and the GPS 212. The synchronization of RF measurements, images, and videos can be performed at the drone in coordination with GPS 212 and the RF data collection componentry 210. The output can be a pulse per second (PPS) output.

The wireless/cellular communications functionality 214 can be configured to both transmit and receive (e.g., a transceiver) wireless signals between other drones 202, data collection units 204, and the server device 208. The camera 216 can include a high-definition camera that can be configured to record both images and videos. In some embodiments, the camera 216 can include monocular and/or stereo vision. For example, the camera 216 can be configured to quantitatively estimate the distance between the drone and an object in its vision. The memory 220 can be configured to store image and video data as obtained by camera 216 and RF data obtained by the RF data collection componentry 210. The memory 220 can also store various pre-programmed flight paths in which the drone 202 should travel to observe various positions. In some embodiments, the rotor 222 and motor 224 can also be coupled in communications with the control module 218 and its processor to facilitate autonomous travel. Note, the drone 202 can include any number of rotors 222 according to desired drone designs and needs. The control module 218 can be configured to control the motor 224 to rotate the rotor(s) 222 to travel.

Figure 2C:
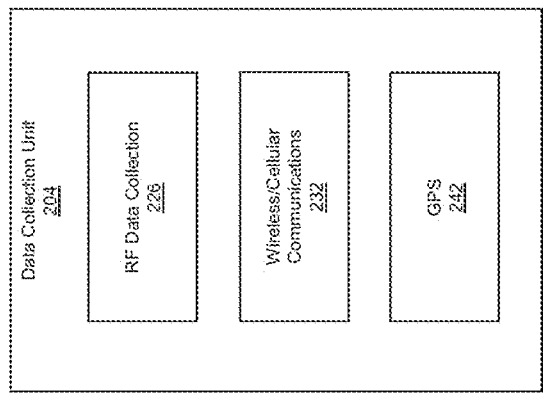

FIG. 2C is a block diagram of an example data collection unit 204, according to some embodiments of the present disclosure. A data collection unit 204 can include an RF data collection component 226, wireless/cellular communications functionality 232, and GPS 242. In some embodiments, the RF data collection component 226 can include the sensors 234, as described in FIG. 2A and can be physically separate from the data collection unit 204. The RF data collection component 226 can include various types of RF sensors and can be configured to measure signals from power frequencies between 50 to 60 Hz and up to 3 GHz. The data collection unit 204 can be mounted or positioned on a powerline structure and can be configured to hold or act as a "nest" for a drone, such as drone 202. In addition, the wireless/cellular communications functionality 232 can be configured to both transmit and receive (e.g., a transceiver) wireless signals between drones 202, other data collection units 204, and the server device 208. For example, when a data collection unit 204 has detected an unusual RF event at a powerline structure or some point on a powerline (e.g., via RF data collection component 226), an alert can be sent wirelessly to the nests of one or more drones 202. The alert can include a relative location of the detected RF event, allowing the drones 202 to autonomously travel to the identified location and perform analysis.

Figure 2D:
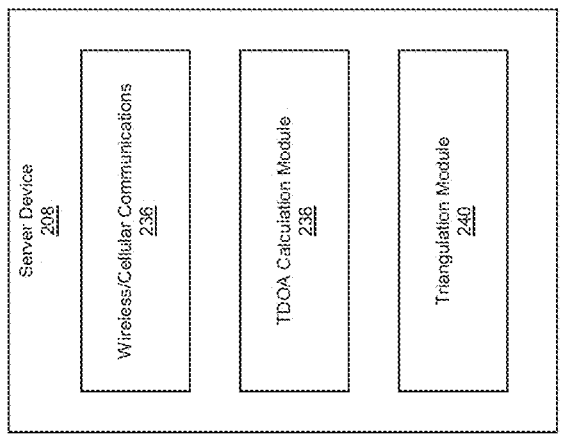

FIG. 2D is a block diagram of an example server device 208, according to some embodiments of the present disclosure. Server device 208 can include wireless/cellular communications functionality 236, a time difference of arrival (TDOA) calculation module 238, and a triangulation module 240. Wireless/cellular communications functionality 236 can be configured to both transmit and receive (e.g., a transceiver) wireless signals between drones 202 and data collection units 204. For example, server device 208 can transmit instructions over a network to a drone 202 to control the travel and flight path of the drone, such as via a remote operator. In another example, server device 208 can receive RF data and measurements and image/video data from one or more drones 202. In some embodiments, TDOA calculation module 238 can be configured to analyze time-synchronized RF and image/video data received from one or more drones 202 (e.g., via wireless/cellular communications functionality 236) to calculate TDOA values for detected RF signals. Additional details related to the algorithm TDOA calculations are described in relation to FIGS. 4 and 5. TDOA calculation module 238 can also be configured to send calculated TDOA values to the triangulation module 240 for additional processing, where triangulation module 240 can analyze the calculated TDOA values (e.g., as calculated by TDOA calculation module 238) and measured TDOA values to triangulate and determine the position of an RF defect. Additional details on the triangulation process are also described with respect to FIGS. 4 and 5.

Figure 3:
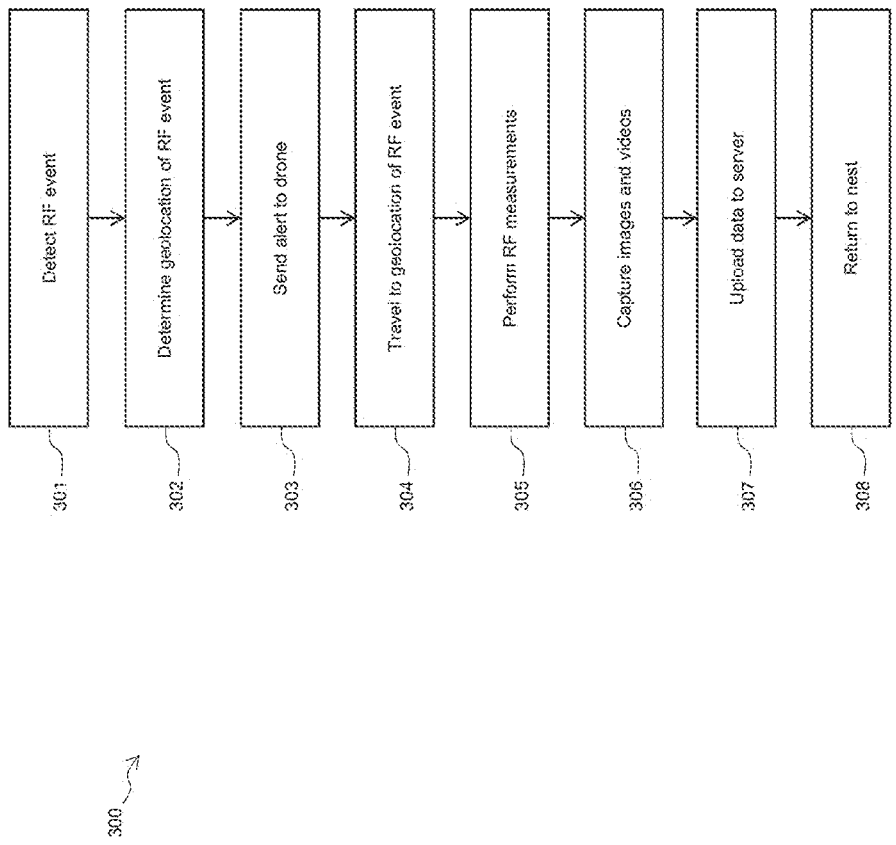
FIG. 3 is a flow diagram showing example processing that may occur to inspect a powerline, according to some embodiments of the present disclosure.

FIG. 3 is a flow diagram showing example process 300 that may occur within the system 200 of FIG. 2A to inspect a powerline, according to some embodiments of the present disclosure. Prior to process 300 being performed, a plurality of drones (e.g., drones 202) may be residing in a plurality of nests (e.g., data collection units 204), which may be situated at various points along a powerline system that includes powerline structures, powerlines, and powerline transmission towers. At block 301, at least one of the sensors 234 detects an RF event, which can be occur anywhere in the powerline system (e.g., on a powerline structure, transmission tower, or the powerline itself). As mentioned earlier, RF defects can potentially cause sparks to fly, triggering fires within equipment, which can spread to buildings and beyond. In some embodiments, an RF event can be detected via the RF data collection component 226 of a data collection unit 204. At block 302, in response to detecting an RF event, the associated data collection unit 204 can determine a geolocation (e.g., via GPS 242) associated with the event.

At block 303, the data collection unit 204 can send an alert to the nests of one or more drones 202. For example, if data collection unit 204a from FIG. 2A was the unit that detected an RF event, data collection unit 204a can send an alert to each of drones 202a-d, including the drone 202 that would be residing in data collection unit 204a and using it as a nest (not shown in FIG. 2A). The alert can include the determined geolocation of the RF event and can be transmitted over the network 206 via the wireless/cellular communications functionality 232 of the data collection unit 204 to the receiving component of the wireless/cellular communications functionality 214 of each drone 202. At block 304 the drones 202 can detach from their respective nests and travel to the received geolocation of the RF event. The drones can be configured to launch and travel autonomously via preprogrammed flightpaths stored within their memory 220. Example flightpaths are discussed in relation to FIGS. 7-10. In some embodiments, if multiple drones have received the alert from the data collection unit 204, each of the drones can be configured to communicate with each other and travel in synchronization to the geolocation using the GPS 212. For example, a data collection unit 204 can send an alert to four drones 202a-d and all four drones 202a-d can travel to the geolocation in synchronization. Once the drones reach the geolocation (e.g., a powerline structure), they can assemble and hover in positions around the geolocation, such as in FIGS. 6A-6B. The hovering positions can be positions that contribute to the inspection effectiveness of the powerline assets at that location. For example, the four drones can hover in positions such that a virtual 3-D volume can be defined by the drones that encloses the relevant section of powerline or asset (e.g., structure, pole, or transmission tower: see FIG. 6B). In addition, each drone can hover outside the safe approach distance of the live conductor, which is the maximum flashover distance plus an allowance for inadvertent movement of the drone, such as 500-1000 mm.

At block 305, once the drones 202 have stabilized in their respective positions around the geolocation, each drone can perform RF measurements. For example, the drones 202 can use the RF data collection componentry 210 to take RF measurements of the relevant section of powerline, the transmission tower, or the powerline structure. In addition, at block 306, each of the drones 202 can take images and/or video using the camera 216. In some embodiments, each of the drones 202 can also record RF measurements while traveling to their hovering positions (e.g., before they are in their final positions). In some embodiments, the recorded RF measurements and image/video data from all drones 202 can be time-stamped and synchronized. In some embodiments, the time-stamping and synchronization can be performed by each drone (e.g., by the associated processor). In some embodiments, the time-stamping and synchronization can be performed by server 208. Additional details on the recording of RF data by drones 202 is discussed in relation to FIG. 4. At block 307, the recorded RF measurements and image/video data can be uploaded by the drones 202, via the network 206, to the server device 208 for analysis, the details of which are described in relation to FIGS. 4 and 5. At block 308, the drones 202 can autonomously travel back to their respective nests (e.g., data collection units 204), engage the nest to be mounted, and begin recharging. In some embodiments, returning to the nest after data recordation can include following the original flight path that was taken to the geolocation. In some embodiments, images and video can be recorded continuously along the flight path of the drone or can be triggered by various conditions.

Figure 4:
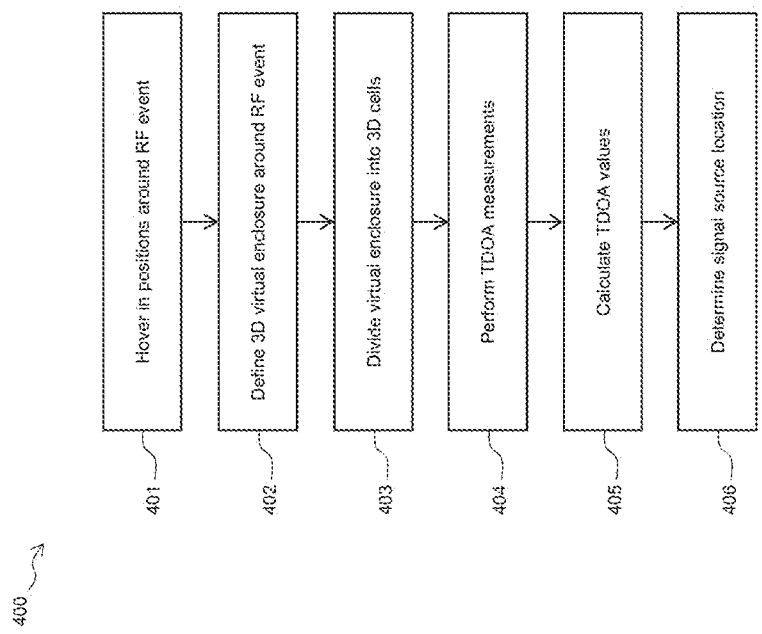
FIG. 4 is a flow diagram showing example processing that may occur to triangulate the position of a signal source, according to some embodiments of the present disclosure.

FIG. 4 is a flow diagram showing example process 400 that may occur to triangulate the position of a signal source, according to some embodiments of the present disclosure. At block 401, similar to as described in relation to FIG. 3, a plurality of drones 202 (e.g., four drones 202a-d, although the present disclosure is not limited to four drones at a time) can hover in positions around an RF event. In some embodiments, the hovering can occur because of an alert received from data collection units 204 regarding a previously detected RF event. The hovering positions can be positions that contribute to the inspection effectiveness of the powerline assets at that location. For example, the four drones can hover in positions such that a virtual 3-D volume can be defined by the drones that encloses the relevant section of powerline or asset (e.g., structure or transmission tower: see FIG. 6B). At block 402, the drones 202 can internally and mathematically define the 3-D virtual enclosure around the RF event via cameras 216 and RF data collection componentry 210. At block 403, the virtual enclosure defined by the positions of the drones 202 can be divided into a plurality of 3-D cells (see FIG. 6B). In some embodiments, each cell can be approximately cube-shaped and have dimensions of between around 1 m×1 m×1 m and 10 m×10 m×10 m. Note, however, a cube-shape (e.g., where all three dimensions are equal) is merely exemplary and all three dimensions of each cell may vary (e.g., a rectangular prism, a tetrahedron, etc.).

At block 404, each of the drones 202 can record RF measurements using the onboard sensors and componentry (e.g., RF data collection componentry 210). In some embodiments, the RF data collection can also be performed while the drones are flying. The measured RF signals can be time-synchronized and coordinated with drone location information (e.g., via GPS 212) to calculate TDOA values. A time difference of arrival (TDOA) is a technique used to determine the location of a signal source using multiple receivers, such as the multiple drones 202. Each of the drones being used can include synchronized clocks. In the embodiment using four drones, each drone 202 is a receiver and can separately detect and measure an RF signal. For example, the detected defect can emit an RF signal at a certain, unknown time: each of the four drones has a time of arrival for when the signal is detected. With four drones, there can be three separate TDOAs relevant to one of the drones. Assuming drone 202*a* can be the base, there is a TDOA between drone 202*b* and drone 202*a* (e.g., the time difference between when drone 202*b* detected the signal and when drone 202*a* detected the signal). There is a second TDOA between drone 202*c* and drone 202*a* and a third TDOA between drone 202*d* and drone 202*a*. The aforementioned TDOAs can be referred to as measured TDOAs or TDOA measurements, as they are "measured" by the drones 202.

At block 405, calculated TDOA values can be determined by calculating a plurality of signal propagation times. More details in relation to the calculation of TDOA values are described in FIG. 5. At block 406, server 208 can determine a signal source location based on the TDOA measurements and the TDOA calculations. For example, the server 208 can receive the measured TDOA values from the drones 202 for processing. In some embodiments, triangulation module 240 can determine the signal source location by analyzing the measured and calculated TDOA values, allowing for a determination of a cell in the virtual 3-D enclosure most likely to be the source of the RF signal, as defined by the positioning of the drones 202. In some embodiments, the determined cell can be found by minimizing the equation below:

$$F(C_{i,j,k}) = \sqrt{\left(\Delta t_{1,2}^m - \Delta t_{1,2}^c\right)^2 + \left(\Delta t_{1,3}^m - \Delta t_{1,3}^c\right)^2 + \ldots + \left(\Delta t_{1,N}^m - \Delta t_{1,N}^c\right)^2}$$

where m denotes measured TDOA values (from block 404), c denotes calculated TDOA values (from block 405), and N denotes the number of sensors or, alternately, the number of drones assuming each drone includes a single sensor. Triangulation module 240 can be configured to minimize the function F using various optimization techniques. One such optimization technique can be the binary particle swamp optimization method, although this is not intended to be limiting. Once the above function has yielded a determined cell location, the determined location can be displayed or sent to a remote operator or agent in charge of monitoring the powerline system or the drone inspection system. Indicating to personnel the most likely location of the detected RF event soon after the actual start of the RF event can mitigate the risk of more catastrophic failure and spreading of fires. Additionally, images and/or video, as taken by the drones 202 during inspection, can also be provided to maintenance personnel during the reporting of the RF event, which can help maintenance and repair proceed more smoothly.

Figure 5:
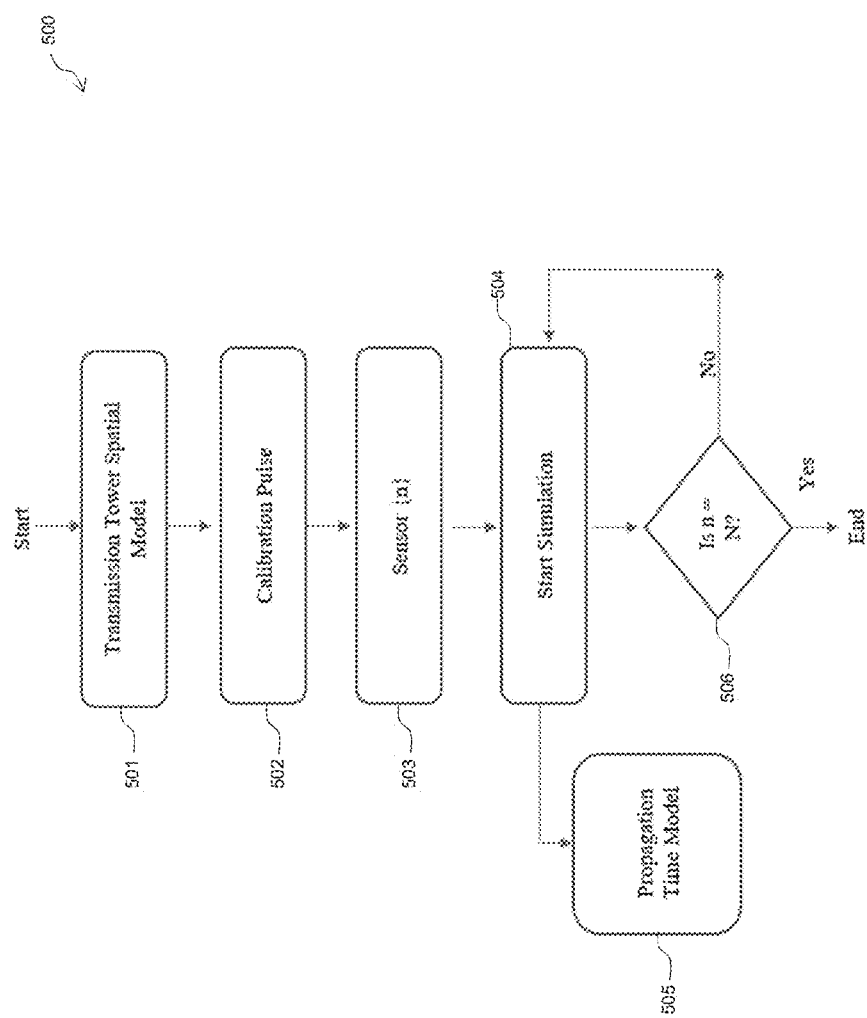
FIG. 5 is another flow diagram showing example processing that may occur to triangulate the position of a signal source, according to some embodiments of the present disclosure.

FIG. 5 is another flow diagram showing example process 500 that may occur to triangulate the position of a signal source (such as at block 405 of process 400), according to some embodiments of the present disclosure. At block 501, one or more drones can travel to hovering locations around a transmission tower, similar to as described in FIG. 4. The hovering locations can be determined according to a transmission tower spatial model, in which the locations of the one or more drones form a 3-D virtual enclosure surrounding the transmission tower. The virtual enclosure can be divided into a plurality of cubic cells or cubes, as described herein. At blocks 502 and 503, a calibration pulse (e.g., a pulse that travels at a known speed, such as the speed of light) from each of the one or more drones or sensors n is prepared. At block 504, the simulation can be started, and, for each drone, a signal propagation time can be calculated from each sensor (e.g., each drone on each sensor) to every cell within the virtual enclosure. At 505, the calculated signal propagation times can form a propagation time model, which can be a matrix that indexes the cells of the enclosure. A propagation time model can be obtained for each sensor or each drone. At block 506, the calculation can be repeated for each sensor or each drone, resulting in multiple propagation signal time matrices. The matrices can be used in block 406 above to determine the signal source or partial discharge location.

Figure 6A:
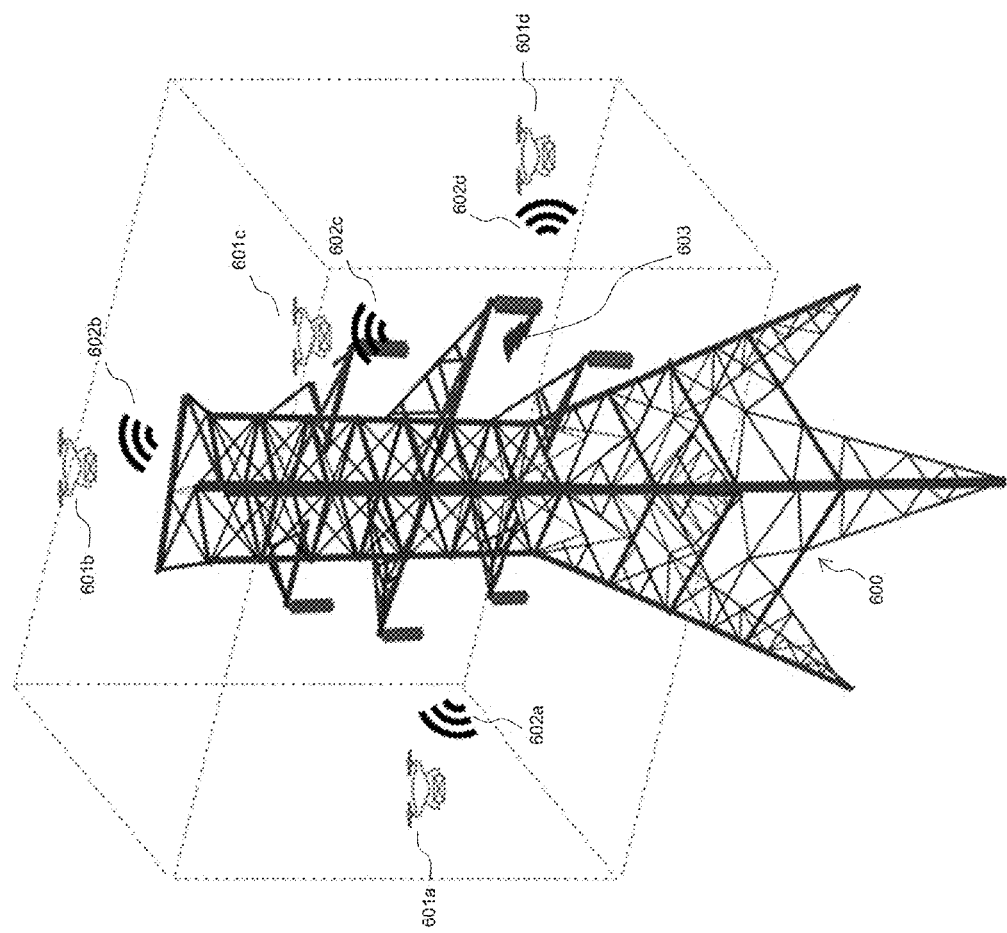
FIGS. 6A-6B show an example transmission tower during a drone inspection, according to some embodiments of the present disclosure.
Figure 6B:
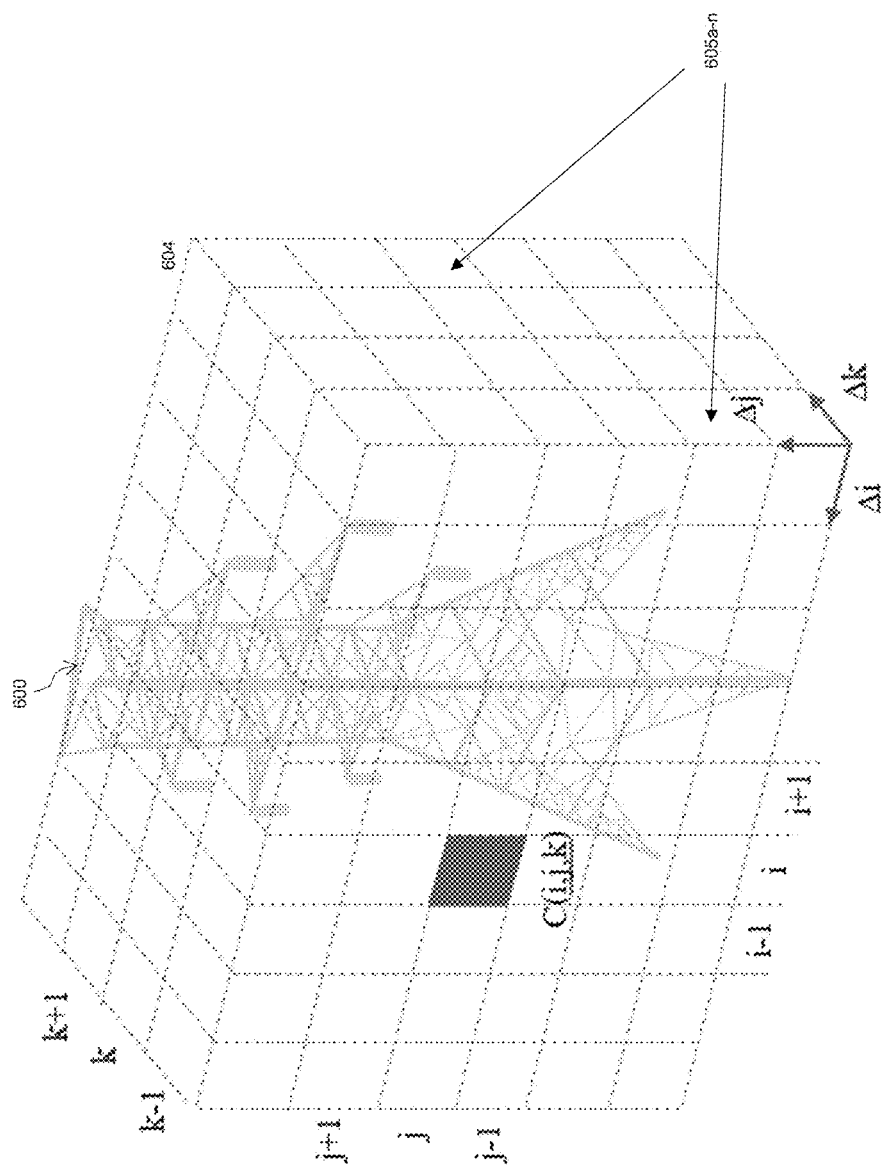

FIGS. 6A-6B show an example transmission tower 600 during a drone inspection, according to some embodiments of the present disclosure. In FIG. 6A, transmission tower 600 can be experiencing a defect, leak, or other RF event as defined herein, such a fault on a powerline. Drones 601*a-d* are hovering in positions surrounding the transmission tower 600 in order to perform an RF inspection and gather data that can be used to identify the RF source 603. In some embodiments, drones 601*a-d* can have traveled to the shown positions similar to as described in process 400, where a plurality of sensors (not shown) detected an RF event and caused the drones 601*a-d* to leave their respective nests (not shown) and travel to the geolocation of the event. The drones 601*a-d*, once in position, can perform RF measurements by detecting the incoming RF signals from the source 603. As described herein, the drones 601*a-d* can include time-synchronized clocks that allow for efficient and accurate comparisons of RF signals and TDOA values between each other. Once the relevant RF measurements have been made, images/video can also be recorded and the drones 601*a-d* can return to their respective nests.

FIG. 6B illustrates an example virtual 3-D enclosure 604 formed by drones 601*a-d* (not shown) that surrounds the transmission tower 600. The enclosure 604 can be split into a plurality of cells 605*a-n* in a three-dimensional grid-like fashion, where each cell 605 can be defined by an i value, a j value, and a k value. The dimensions of each cell 605 can vary depending on desired levels of precision and available computational resources. For example, while cells 605 with smaller dimensions (e.g., centimeter or inch scales) can yield more precision than cells 605 with larger dimensions (e.g., feet, yards, or meters), the available computational resources may dictate the size of the created cells 605. In some embodiments, the desired precision may not warrant the additional need to perform calculations for smaller and more plentiful cells.

Figure 7:
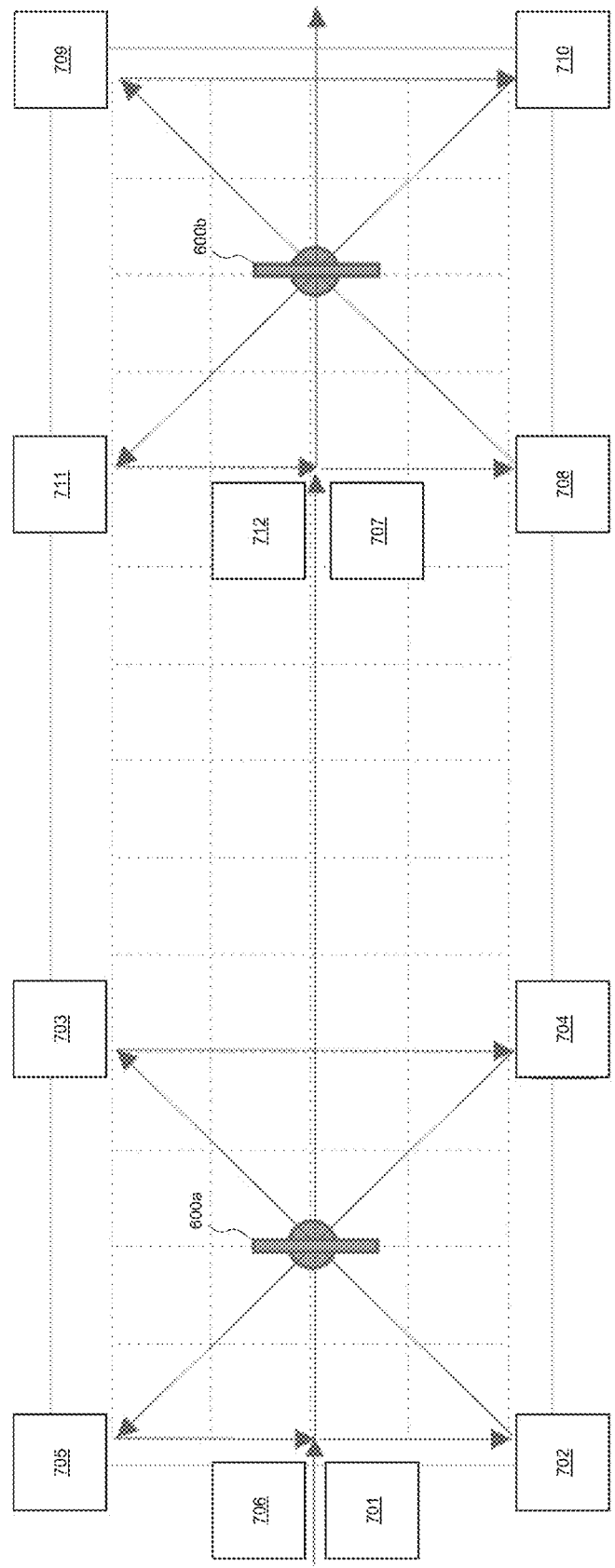
FIGS. 7-10 show example flight paths for a drone, according to some embodiments of the present disclosure.

FIGS. 7-10 show example flight paths for a drone, according to some embodiments of the present disclosure. The illustrated example flight paths in FIGS. 7-9 can be for a single drone (e.g., drone 202 or drone 601, although the drone is not shown) to inspect two transmission towers 600a and 600b. The flight path may be pre-programmed into the drone and stored in the memory 220 for use by the control module 218 in directing autonomous travel. In FIG. 7, the drone can fly from a nest (not shown) to position 701. The drone can then move from position 701 to the remaining positions (positions 702-712) in order and in straight lines. The flight path can include six positions around each transmission tower 600a-b. At each position, the drone can be programmed to record RF data and take images/video. In some embodiments, the drone can continue to record RF data while traveling between positions. Upon completion of position 909, the drone can return to its nest. In some embodiments, each drone path described herein can be initiated upon the receiving of an alert of an RF event detection.

Figure 8:
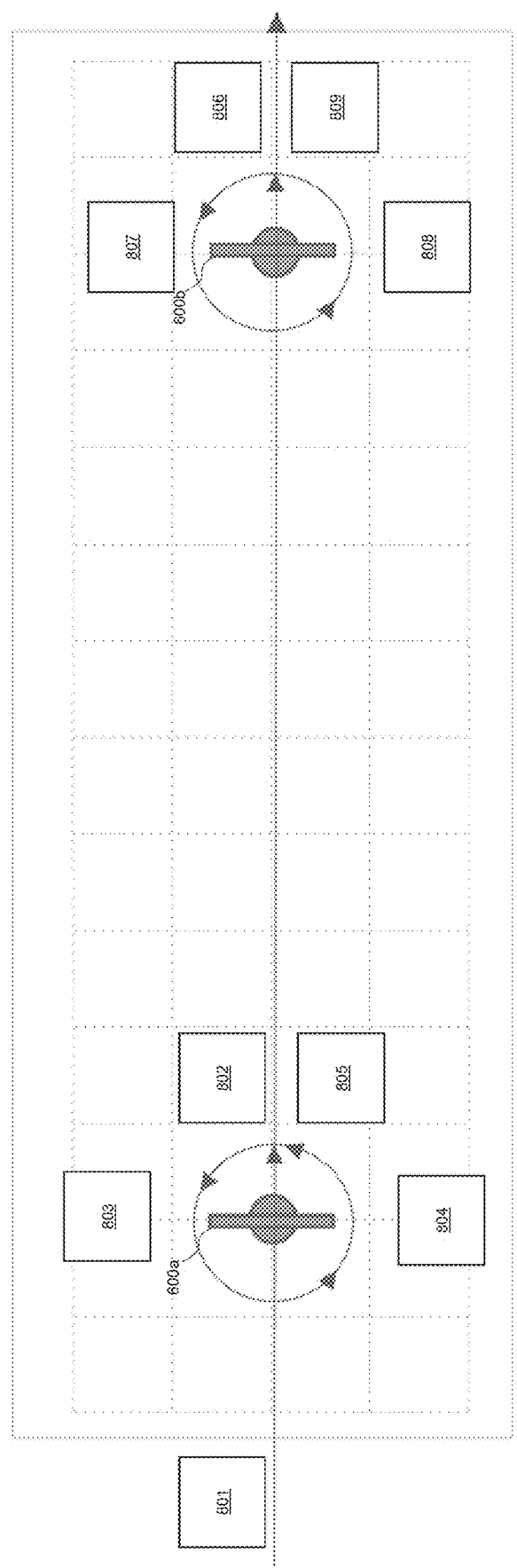

FIG. 8 illustrates another example flight path that a single drone can take to inspect the two transmission towers 600a-b. The flight path of FIG. 8 can be pre-programmed into the drone and stored in the memory 220 for use by the control module 218 in directing autonomous travel. Similar to the flight path of FIG. 7, the flight path of FIG. 8 can begin at position 801 after flying from a nest (not shown). Also similar to the flight path of FIG. 7, the drone can travel to the remaining positions in order (802-809). However, the flight path of FIG. 8 can include curved trajectories and not just straight lines of travel. For example, the drone can travel in a circular path around each transmission tower. At positions 802-805, the drone can travel counterclockwise around the transmission tower 600a and record time-synchronized measurements as described herein. From there, the drone can travel to transmission tower 600b and utilize similar positions and trajectories (positions 806-809). At each position, the drone can be programmed to record RF data and take images/video. In some embodiments, the drone can continue to record RF data while traveling between positions. Upon completion of position 909, the drone can return to its nest.

Figure 9:
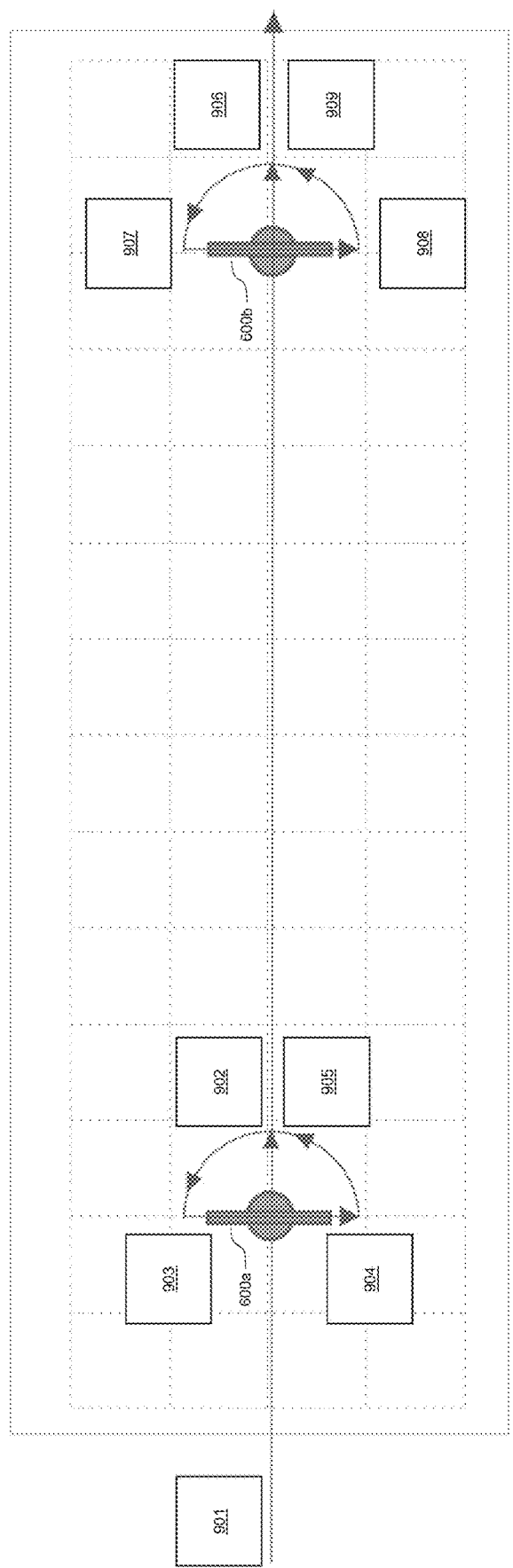

FIG. 9 illustrates another example flight path that a single drone can take to inspect the two transmission towers 600a-b. The flight path of FIG. 9 can be pre-programmed into the drone and stored in the memory 220 for use by the control module 218 in directing autonomous travel. Similar to the flight paths of FIGS. 7 and 8, the flight path of FIG. 9 can begin at position 901 after flying from a nest (not shown). Also similar to the flight paths of FIGS. 7 and 8, the drone can travel to the remaining positions in order (902-909). However, the flight path of FIG. 9 can include both curved and straight-line trajectories in a combination of trajectories from FIGS. 7 and 8. For example, the drone can travel in semi-circular paths around each transmission tower. At position 902-905, the drone can travel in a quarter-arc from 902 to 903, in a straight-line path from 903 to 904, and in another quarter-arc from 904 to 905. At these positions, the drone can record time-synchronized measurements of transmission tower 600a as described herein. From position 905, the drone can travel to position 906 and utilize a similar path to inspect transmission tower 600b (positions 906-909). At each position, the drone can be programmed to record RF data and take images/video. In some embodiments, the drone can continue to record RF data while traveling between positions. Upon completion of position 909, the drone can return to its nest.

In some embodiments, in the context of processes of FIGS. 3-5 and the systems described herein, each drone can include the flight paths of all of FIGS. 7-9 pre-programmed into their memory for autonomous travel. In some embodiments, a drone may include additional flight paths, as well. In some embodiments, a drone may not be restricted to travel along a single flight path and may employ a combination of one or more flight paths while traveling.

Figure 10:
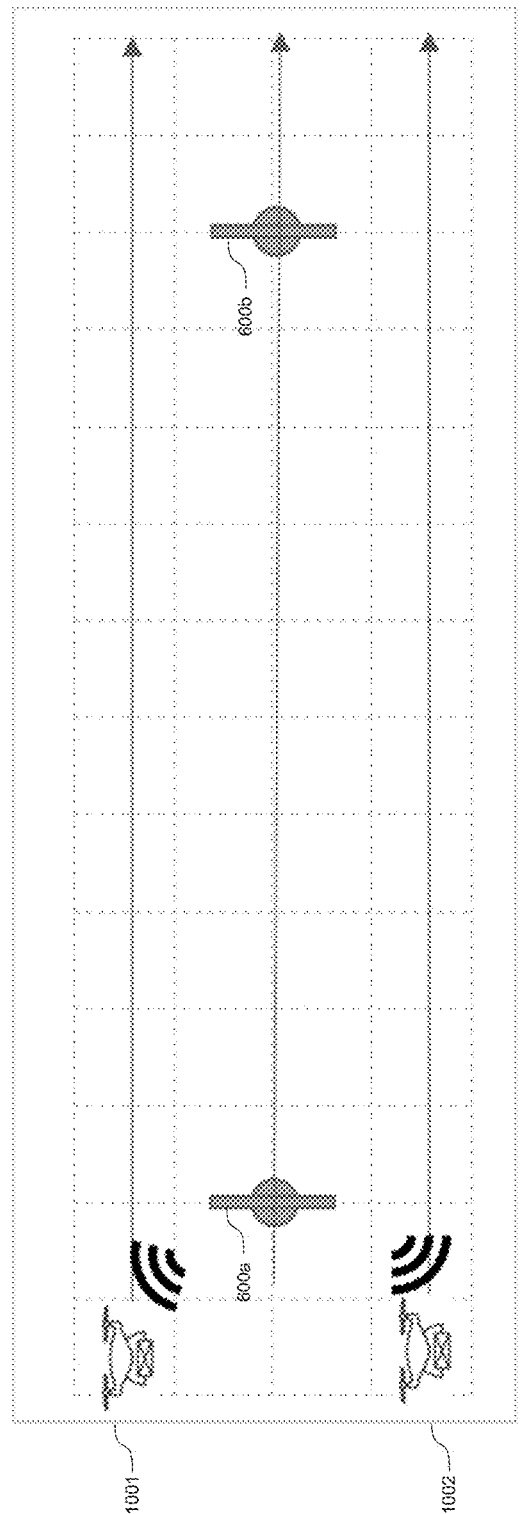

FIG. 10 illustrates an example flight path that a pair of drones 1001 and 1002 can take to inspect two transmission towers 600a-b, according to some embodiments of the present disclosure. The drones 1001 and 1002 can travel synchronously, which can include physical movement that is in synchronization with each other, as well as internal clocks that are in synchronization with each other. While the drones 1001 and 1002 are traveling along the respective paths, they can each continuously or repeatedly record RF measurements, which can allow for easier-to-process and more informative data gathering (e.g., measurement of TDOA values). For example, if the transmission tower 600a has a defect on the side closer to drone 1002, both drones will detect the signal but at different times. However, because their clocks are synchronized, it can reliably be determined the difference in the time of arrival of the RF signal to each drone. Additionally, as the geolocation of each drone is also being recorded, the location of the source can be that much more easily detected.

Figure 11:
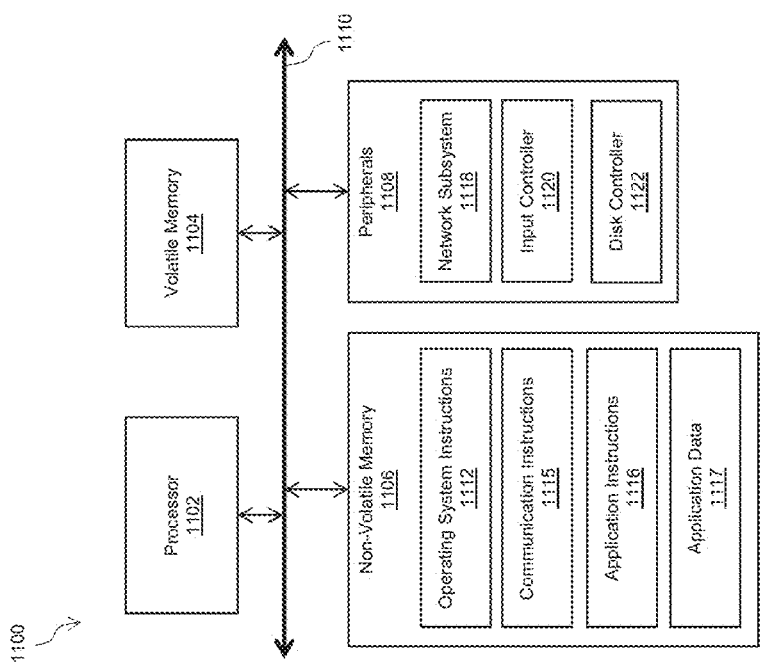
FIG. 11 shows an example server device that may be used within the system of FIG. 2A, according to some embodiments of the present disclosure.

FIG. 11 shows an example server device 1100 that may be used within the system of FIG. 2A, according to some embodiments of the present disclosure. Server device 1100 may implement various features and processes as described herein. Server device 1100 may be implemented on any electronic device that runs software applications derived from complied instructions, including without limitation personal computers, servers, smart phones, media players, electronic tablets, game consoles, email devices, etc. In some implementations, server device 1100 may include one or more processors 1102, volatile memory 1104, non-volatile memory 1106, and one or more peripherals 1108. These components may be interconnected by one or more computer buses 1110.

Processor(s) 1102 may use any known processor technology, including but not limited to graphics processors and multi-core processors. Suitable processors for the execution of a program of instructions may include, by way of example, both general and special purpose microprocessors, and the sole processor or one of multiple processors or cores, of any kind of computer. Bus 1110 may be any known internal or external bus technology, including but not limited to ISA, EISA, PCI, PCI Express, USB, Serial ATA, or FireWire. Volatile memory 1104 may include, for example, SDRAM. Processor 1102 may receive instructions and data from a read-only memory or a random access memory or both. Essential elements of a computer may include a processor for executing instructions and one or more memories for storing instructions and data.

Non-volatile memory 1106 may include by way of example semiconductor memory devices, such as EPROM, EEPROM, and flash memory devices; magnetic disks such as internal hard disks and removable disks; magneto-optical disks; and CD-ROM and DVD-ROM disks. Non-volatile memory 1106 may store various computer instructions including operating system instructions 1112, communication instructions 1115, application instructions 1116, and application data 1117. Operating system instructions 1112 may include instructions for implementing an operating system (e.g., Mac OS®, Windows®, or Linux). The operating system may be multi-user, multiprocessing, multitasking, multithreading, real-time, and the like. Communication instructions 1115 may include network communications instructions, for example, software for implementing communication protocols, such as TCP/IP, HTTP, Ethernet, telephony, etc. Application instructions 1116 may include instructions for performing various processes in accordance with the drone system for powerline inspection as described herein. For example, application instructions 1116 may include instructions for components 236-240 described above in conjunction with FIG. 2A. Application data 1117 may include data corresponding to 236-240 described above in conjunction with FIG. 2A.

Peripherals 1108 may be included within server device 1100 or operatively coupled to communicate with server device 1100. Peripherals 1108 may include, for example, network subsystem 1118, input controller 1120, and disk controller 1122. Network subsystem 1118 may include, for example, an Ethernet of WiFi adapter. Input controller 1120 may be any known input device technology, including but not limited to a keyboard (including a virtual keyboard), mouse, track ball, and touch-sensitive pad or display. Disk controller 1122 may include one or more mass storage devices for storing data files; such devices include magnetic disks, such as internal hard disks and removable disks; magneto-optical disks; and optical disks.

The described features may be implemented in one or more computer programs that may be executable on a programmable system including at least one programmable processor coupled to receive data and instructions from, and to transmit data and instructions to, a data storage system, at least one input device, and at least one output device. A computer program is a set of instructions that may be used, directly or indirectly, in a computer to perform a certain activity or bring about a certain result. A computer program may be written in any form of programming language (e.g., Objective-C, Java), including compiled or interpreted languages, and it may be deployed in any form, including as a stand-alone program or as a module, component, subroutine, or other unit suitable for use in a computing environment.

Suitable processors for the execution of a program of instructions may include, by way of example, both general and special purpose microprocessors, and the sole processor or one of multiple processors or cores, of any kind of computer. Generally, a processor may receive instructions and data from a read-only memory or a random access memory or both. The essential elements of a computer may include a processor for executing instructions and one or more memories for storing instructions and data. Generally, a computer may also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data may include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory may be supplemented by, or incorporated in, ASICs (application-specific integrated circuits).

To provide for interaction with a user, the features may be implemented on a computer having a display device such as an LED or LCD monitor for displaying information to the user and a keyboard and a pointing device such as a mouse or a trackball by which the user may provide input to the computer.

The features may be implemented in a computer system that includes a back-end component, such as a data server, or that includes a middleware component, such as an application server or an Internet server, or that includes a front-end component, such as a client computer having a graphical user interface or an Internet browser, or any combination thereof. The components of the system may be connected by any form or medium of digital data communication such as a communication network. Examples of communication networks include, e.g., a telephone network, a LAN, a WAN, and the computers and networks forming the Internet.

The computer system may include clients and servers. A client and server may generally be remote from each other and may typically interact through a network. The relationship of client and server may arise by virtue of computer programs running on the respective computers and having a client-server relationship to each other.

One or more features or steps of the disclosed embodiments may be implemented using an API. An API may define one or more parameters that are passed between a calling application and other software code (e.g., an operating system, library routine, function) that provides a service, that provides data, or that performs an operation or a computation.

The API may be implemented as one or more calls in program code that send or receive one or more parameters through a parameter list or other structure based on a call convention defined in an API specification document. A parameter may be a constant, a key, a data structure, an object, an object class, a variable, a data type, a pointer, an array, a list, or another call. API calls and parameters may be implemented in any programming language. The programming language may define the vocabulary and calling convention that a programmer will employ to access functions supporting the API.

In some implementations, an API call may report to an application the capabilities of a device running the application, such as input capability, output capability, processing capability, power capability, communications capability, etc.

While various embodiments have been described above, it should be understood that they have been presented by way of example and not limitation. It will be apparent to persons skilled in the relevant art(s) that various changes in form and detail may be made therein without departing from the spirit and scope. In fact, after reading the above description, it will be apparent to one skilled in the relevant art(s) how to implement alternative embodiments. For example, other steps may be provided, or steps may be eliminated, from the described flows, and other components may be added to, or removed from, the described systems. Accordingly, other implementations are within the scope of the following claims.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. It is important, therefore, that the claims be regarded as including such equivalent constructions insofar as they do not depart from the spirit and scope of the disclosed subject matter.

While various embodiments have been described above, it should be understood that they have been presented by way of example and not limitation. It will be apparent to persons skilled in the relevant art(s) that various changes in form and detail may be made therein without departing from the spirit and scope. In fact, after reading the above description, it will be apparent to one skilled in the relevant art(s) how to implement alternative embodiments. For example, other steps may be provided, or steps may be eliminated, from the described flows, and other components may be added to, or removed from, the described systems. Accordingly, other implementations are within the scope of the following claims.

In addition, it should be understood that any figures which highlight the functionality and advantages are presented for example purposes only. The disclosed methodology and system are each sufficiently flexible and configurable such that they may be utilized in ways other than that shown.

Although the term "at least one" may often be used in the specification, claims and drawings, the terms "a", "an", "the", "said", etc. also signify "at least one" or "the at least one" in the specification, claims and drawings.

Finally, it is the applicant's intent that only claims that include the express language "means for" or "step for" be interpreted under 35 U.S.C. 112(f). Claims that do not expressly include the phrase "means for" or "step for" are not to be interpreted under 35 U.S.C. 112(f).

Although the disclosed subject matter has been described and illustrated in the foregoing illustrative embodiments, it is understood that the present disclosure has been made only by way of example, and that numerous changes in the details of implementation of the disclosed subject matter may be made without departing from the spirit and scope of the disclosed subject matter.

The invention claimed is:

1. A system for locating a signal source of an electrical event in an electrical structure comprising:
    a plurality of drones capable of hovering in positions to form a virtual enclosure around an electrical structure, wherein the virtual enclosure is divided into a plurality of cells, each drone being configured to:
    measure a plurality of time difference of arrival (TDOA) values from signals originating from the source;
    calculate a plurality of propagation times comprising a propagation time for a calibration signal that travels from a respective drone to each of the plurality of cells; and
    send the plurality of TDOA values and the plurality of propagation times to a server;
    the server communicably coupled to the plurality of drones configured to:
    receive the plurality of TDOA values and the plurality of propagation times from the plurality of drones; and
    determine a location of the source based on the plurality of TDOA values and the plurality of propagation times.

2. The system of claim 1, wherein the plurality of drones comprises at least four drones.

3. The system of claim 1, wherein each of the plurality of drones comprises at least one radio frequency (RF) sensor configured to measure signals from power frequencies between about 50 Hz and 3 GHz.

4. The system of claim 1, wherein the plurality of drones are configured to perform measurements at a safe approach distance from the electrical structure.

5. The system of claim 1, wherein each of the plurality of drones comprises GPS functionality and the plurality of drones is configured to perform time-synchronized RF measurements using the GPS functionality.

6. The system of claim 1, wherein each of the plurality of cell is between about 1 m×1 m×1 m and 10 m×10 m×10 m.

7. The system of claim 1, wherein the determining a location of the source based on the plurality of TDOA values and the plurality of propagation times comprises identifying a cell of the plurality of cells with a highest likelihood of being the source.

8. The system of claim 7, wherein the identifying a cell of the plurality of cells with a highest likelihood of being the source comprises applying a binary particle swamp optimization method.

9. A method performed by a server for locating a signal source of an electrical event in an electrical structure comprising:
    receiving, from a plurality of drones, a plurality of time difference of arrival (TDOA) values from signals originating from the source on an electrical structure, wherein the plurality of drones are hovering in positions to form a virtual enclosure around the electrical structure, the virtual enclosure being divided into a plurality of cells;
    receiving, from the plurality of drones, a plurality of propagation times comprising a propagation time for a calibration signal that travels from a respective drone to each of the plurality of cells; and
    analyzing the plurality of TDOA values and the plurality of propagation times to determine a location of the source.

10. The method of claim 9, wherein the determining a location of the source based on the plurality of TDOA values and the plurality of propagation times comprises identifying a cell of the plurality of cells with a highest likelihood of being the source.

11. The method of claim 10, wherein the identifying a cell of the plurality of cells with a highest likelihood of being the source comprises applying a binary particle swamp optimization method.

12. The method of claim 9, wherein each of the plurality of cell is between about 1 m×1 m×1 m and 10 m×10 m×10 m.

13. The method of claim 9, wherein the plurality of drones comprises at least four drones.

14. The method of claim 9, wherein each of the plurality of drones comprises at least one radio frequency (RF) sensor configured to measure signals from power frequencies between about 50 Hz and 3 GHz.

15. The method of claim 9, wherein each of the plurality of drones comprises GPS functionality and the plurality of drones is configured to perform time-synchronized RF measurements using the GPS functionality.

16. A method for locating a signal source of an electrical event in an electrical structure comprising:
    positioning a plurality of drones in positions to form a virtual enclosure around an electrical structure comprising the source emitting signals;
    dividing the virtual enclosure into a plurality of cells;
    measuring a plurality of time difference of arrival (TDOA) values from the signals originating from the source;
    calculating a plurality of propagation times comprising a propagation time for a calibration signal that travels from a respective drone to each of the plurality of cells; and sending the plurality of TDOA values and the plurality of propagation times to a server, wherein the server determines a location of the source based on the plurality of TDOA values and the plurality of propagation times.

17. The method of claim 16, wherein each of the plurality of drones comprises at least one radio frequency (RF) sensor configured to measure signals from power frequencies between about 50 Hz and 3 GHz.

18. The method of claim 16, wherein each of the plurality of cell is between about 1 m×1 m×1 m and 10 m×10 m×10 m.

19. The method of claim 16, wherein each of the plurality of drones comprises GPS functionality and the plurality of drones is configured to perform time-synchronized RF measurements using the GPS functionality.

20. The method of claim 16, wherein the plurality of drones are configured to perform measurements at a safe approach distance from the electrical structure.

* * * * *